United States Patent
Mouli

(10) Patent No.: US 8,232,585 B2
(45) Date of Patent: Jul. 31, 2012

(54) JFET DEVICES WITH PIN GATE STACKS

(75) Inventor: Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1041 days.

(21) Appl. No.: 12/179,330

(22) Filed: Jul. 24, 2008

(65) Prior Publication Data

US 2010/0019291 A1    Jan. 28, 2010

(51) Int. Cl.
    *H01L 29/66* (2006.01)
(52) U.S. Cl. .............................. 257/272; 257/E29.312
(58) Field of Classification Search .......... 257/272–278, 257/E21.445, E29.312–E29.315; 438/186
    See application file for complete search history.

(56) References Cited

U.S. PATENT DOCUMENTS

| 4,612,629 A | 9/1986 | Harari |
| 4,679,298 A | 7/1987 | Zuleeg et al. |
| 5,243,209 A | 9/1993 | Ishii |
| 5,321,283 A | 6/1994 | Cogan et al. |
| 5,357,127 A | 10/1994 | Park et al. |
| 5,378,642 A | 1/1995 | Brown et al. |
| 5,393,998 A | 2/1995 | Ishii et al. |
| 6,174,763 B1 | 1/2001 | Beilstein et al. |
| 6,271,550 B1 | 8/2001 | Gehrmann |
| 6,310,378 B1 | 10/2001 | Letavic et al. |
| 6,313,489 B1 | 11/2001 | Letavic et al. |
| 6,404,015 B2 | 6/2002 | Emmerik et al. |
| 6,503,782 B2 | 1/2003 | Casady et al. |
| 6,590,260 B1 * | 7/2003 | Yang et al. ............. 257/347 |
| 6,767,783 B2 | 7/2004 | Casady et al. |
| 6,936,866 B2 | 8/2005 | Deboy et al. |
| 7,049,196 B2 | 5/2006 | Noble |
| 7,122,411 B2 | 10/2006 | Mouli |
| 7,199,442 B2 | 4/2007 | Shenoy |
| 7,202,528 B2 | 4/2007 | Sankin et al. |
| 7,288,821 B2 | 10/2007 | Kwon |
| 7,294,860 B2 | 11/2007 | Mazzola et al. |
| 2005/0077577 A1 * | 4/2005 | Manna et al. ........... 257/355 |
| 2006/0046355 A1 | 3/2006 | Parekh et al. |
| 2006/0197129 A1 | 9/2006 | Wohlmuth |
| 2007/0096144 A1 | 5/2007 | Kapoor |

FOREIGN PATENT DOCUMENTS

| JP | 5129559 | 5/1993 |
| WO | WO8808617 | 11/1988 |

OTHER PUBLICATIONS

U.S. Appl. No. 12/179,330, filed Jul. 24, 2008; Applicant: Chandra Mouli; Entitled: JFET Devices with PIN Gate Stacks and Methods of Making Same.
U.S. Appl. No. 12/333,012, filed Dec. 11, 2008; Applicant: Chandra Mouli; Entitled: JFET Device Structures and Methods for Fabricating the Same.

(Continued)

*Primary Examiner* — Tucker Wright
(74) *Attorney, Agent, or Firm* — Fletcher Yoder

(57) ABSTRACT

Devices and methods for providing JFET transistors with improved operating characteristics are provided. Specifically, one or more embodiments of the present invention relate to JFET transistors with a higher diode turn-on voltage. For example, one or more embodiments include a JFET with a PIN gate stack. One or more embodiments also relate to systems and devices in which the improved JFET may be employed, as well as methods of manufacturing the improved JFET.

16 Claims, 6 Drawing Sheets

OTHER PUBLICATIONS

U.S. Appl. No. 12/333,067, filed Dec. 11, 2008; Applicant: Chandra Mouli; Entitled: Low Power Memory Device with JFET Device Structures.

Dungan, T.E. et al.; One-Transistor GaAs MESFET and JFET Accessed Dynamic RAM Cells for High-Speed Medium Density Applications; IEEE Transportation on Electronic Devices; Jul. 1990, vol. 37, pp. 1599-1607.

Waldrop, J.R.; Schottky Barrier Height of Metal Contacts to P-Type Alpha 6H-SiC; J. Appl. Phys. 75 (9) 1994.

Mitleher et al.; Switching Behaviour of Fast High Voltage SiC pn—Diodes; Proceedings of 1998 International Symposium on Power Semiconductor Devices and ICs, Kyoto, pp. 127-130.

Round, S. et al.; A SiC JFET Driver for A 5 Kw, 150 KhZ Three-Phase PWM Converter; IEEE Conference, Pub. Oct. 2-6, 2005, pp. 410-416.

Funaki, T. et al.; Characterization of SiC JFET for Temperature Dependent Device Modeling; IEEE Conference, Pub. Jun. 18-22, 2006, pp. 1-6.

* cited by examiner

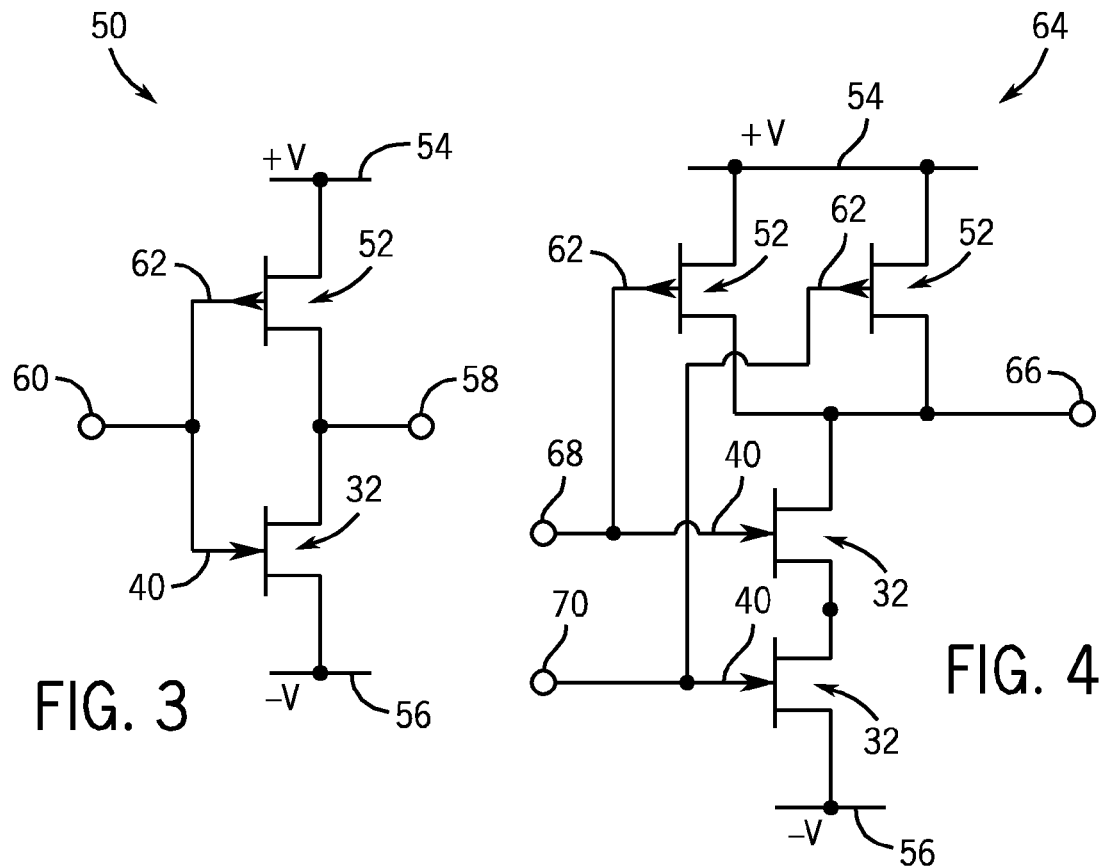
FIG. 3
FIG. 4
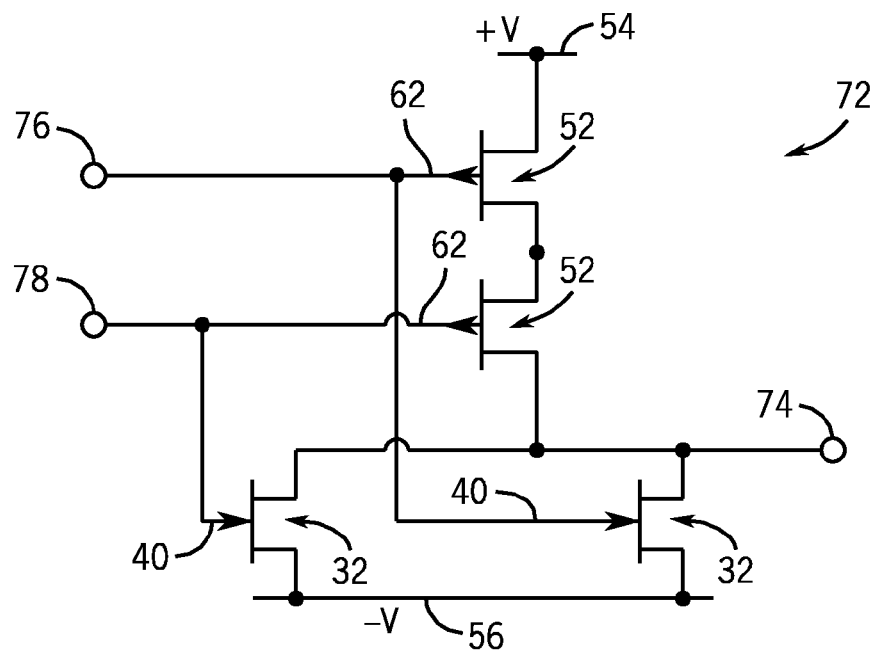
FIG. 5

JFET DEVICES WITH PIN GATE STACKS

BACKGROUND

1. Field of the Invention

Embodiments of the present invention relate generally to the field of semiconductor devices. More particularly, embodiments of the present invention relate to improved semiconductor devices and techniques for fabricating improved semiconductor devices.

2. Description of the Related Art

Currently, the most commonly used transistor for implementing logic devices in integrated circuits is the metal-oxide semiconductor field effect transistor (MOSFET). In particular, the combination of complementary n-type and p-type MOSFETs, a technology known as "CMOS," allows for the creation of low power logic devices. Because n-MOS and p-MOS devices are connected in series, no drain current flows—except for a small charging current during the switching process between two different states. Furthermore, improved fabrication techniques have, over the years, led to the reduction of MOSFET sizes through a technique known as "scaling," which has led to smaller, more densely packed, and faster chips.

More recently, however, the speed benefits typically associated with scaling have diminished due to fundamental physical constraints inherent in MOSFETs. For example, in order to switch the voltage state of a MOSFET, the MOSFETs gate terminal must be sufficiently charged. The amount of charge that will switch the MOSFET on is proportional to the capacitance of the MOSFET's gate terminal. One consequence of scaling is that the thickness of the gate insulator must be reduced to maintain acceptably small short-channel effects. Furthermore, to counteract the increased leakage current that may result from the reduced dielectric thickness and thereby keep the gate leakage current below acceptable levels, the gate insulator may be made of a dielectric with a dielectric constant, "k," higher than that of silicon dioxide, whose k equals 3.9. Both the reduced thickness and the higher dielectric constant result in higher capacitance. Therefore, although the maximum drain current may increase for the scaled CMOS device, this benefit is largely limited by the increased capacitance. The result is that although the density of CMOS devices continues to increase, the speed performance of such devices has not increased substantially over the generations.

Junction field effect transistors (JFETs), on the other hand, do not utilize an insulated gate. Rather, in a typical JFET, the gate is a p-doped or n-doped semiconductor material and the gate directly contacts the semiconductor body, forming a p-n junction between the gate and the transistor's conductive channel. Because JFETs do not utilize an insulated gate, the total gate capacitance in a JFET may be greatly reduced, which may result in a higher transistor switching speed compared to existing CMOS technology.

However, typical JFETs have limited applicability due to the low forward-bias turn-on voltage, i.e. the diode turn-on voltage, of the p-n junction between the gate and the channel of the JFET. In a typical JFET, the depletion region at the gate-channel interface prevents conduction when the gate potential is sufficiently low. To turn on the JFET, the gate potential is raised, which narrows the depletion region, allowing current to flow between the source and the drain. When the gate potential is raised above the forward bias potential of the p-n junction between the gate and the channel (typically 0.6 to 0.7 volts), current then starts to flow from the gate to the drain. This greatly increases the power consumption of the device. There is a limit, therefore, to the voltage that may be applied to a JFET. As a result, typical prior art JFETs may not be suitable in systems or devices which utilize a high voltage relative to the diode turn-on voltage of the JFET.

Therefore, it may be advantageous to provide an improved low-power semiconductor device with reduced gate capacitance and faster switching speed compared to existing CMOS technology. Specifically, it may be advantageous to provide a JFET with improved electrical characteristics that address the limitations discussed above.

BRIEF DESCRIPTION OF THE DRAWINGS

FIGS. 3-5 are circuit schematics of logic devices, incorporating complementary PIN-gate JFETs in accordance with embodiments of the present invention;

DETAILED DESCRIPTION

Embodiments of the present invention relate to JFETs with improved electrical characteristics that address the limitations discussed above, making them more suitable for use in a wide range of semiconductor devices, such as logic devices and memory access devices. Specifically, several embodiments relate to methods and devices for raising the voltage level that may be applied to the gate of a JFET without exceeding the diode turn-on voltage of the p-n junction between the gate and the channel. Several embodiments also relate to systems and devices that include JFETs with improved electrical characteristics.

For the sake of clarity, it is noted that in discussing the relationship between deposited materials, the terms "over," or "above" are used to describe materials that are connected but that may, or may not, be in direct contact. By contrast, the term "directly on" is used to indicate direct contact between the materials described.

Figure 1:
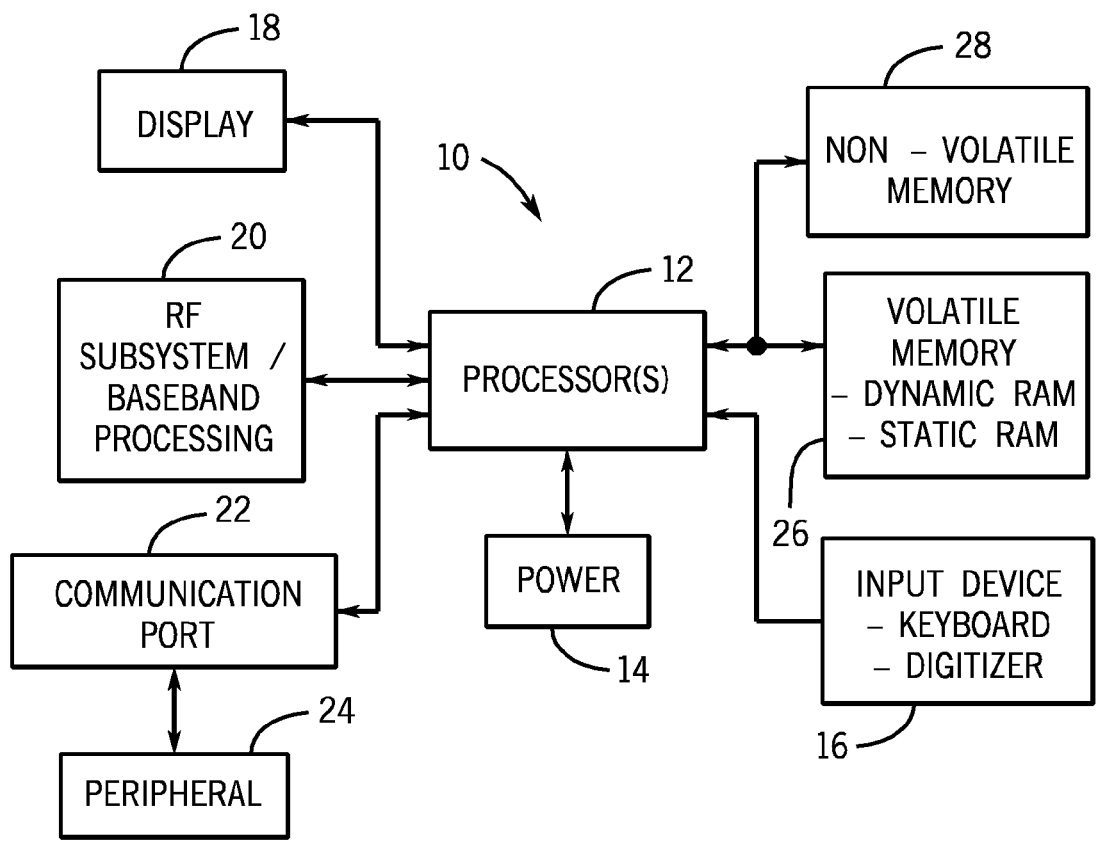
FIG. 1 illustrates a block diagram of a processor-based device in accordance with embodiments of the present invention.

Turning now to the drawings, and referring initially to FIG. 1, a block diagram depicting a processor-based system, generally designated by reference numeral 10, is illustrated. The system 10 may be any of a variety of types such as a computer, pager, cellular phone, personal organizer, control circuit, etc. In a typical processor-based device, one or more processors 12, such as a microprocessor, control the processing of system functions and requests in the system 10. As will be appreciated, the processor 12 may include an embedded North or South bridge (not shown), for coupling each of the aforementioned components thereto. Alternatively, the bridges may include separate bridges coupled between the processor 12 and the various components of the system 10.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance. Various other devices may be coupled to the processor 12 depending on the functions that the system 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example. Furthermore, an RF sub-system/baseband processor 20 may also be coupled to the processor 12. The RF sub-system/baseband processor 20 may include an antenna that is coupled to an RF receiver and to an RF transmitter (not shown). One or more communication ports 22 may also be coupled to the processor 12. The communication port 22 may be adapted to be coupled to one or more peripheral devices 24 such as a modem, a printer, a computer, or to a network, such as a local area network, remote area network, intranet, or the Internet, for instance.

Because the processor 12 generally controls the functioning of the system 10 by implementing software programs, memory is operably coupled to the processor 12 to store and facilitate execution of various programs. For instance, the processor 12 may be coupled to the volatile memory 26 which may include Dynamic Random Access Memory (DRAM) and/or Static Random Access Memory (SRAM). The volatile memory 26 may include a number of memory modules, such as single inline memory modules (SIMMs) or dual inline memory modules (DIMMs). As can be appreciated, the volatile memory 26 may simply be referred to as the "system memory." The volatile memory 26 is typically quite large so that it can store dynamically loaded applications and data.

The processor 12 may also be coupled to non-volatile memory 28. The non-volatile memory 28 may include a read-only memory (ROM), such as an EPROM, and/or flash memory to be used in conjunction with the volatile memory. The size of the ROM is typically selected to be just large enough to store any necessary operating system, application programs, and fixed data. Additionally, the non-volatile memory 28 may include a high capacity memory such as a tape or disk drive memory.

Figure 2:
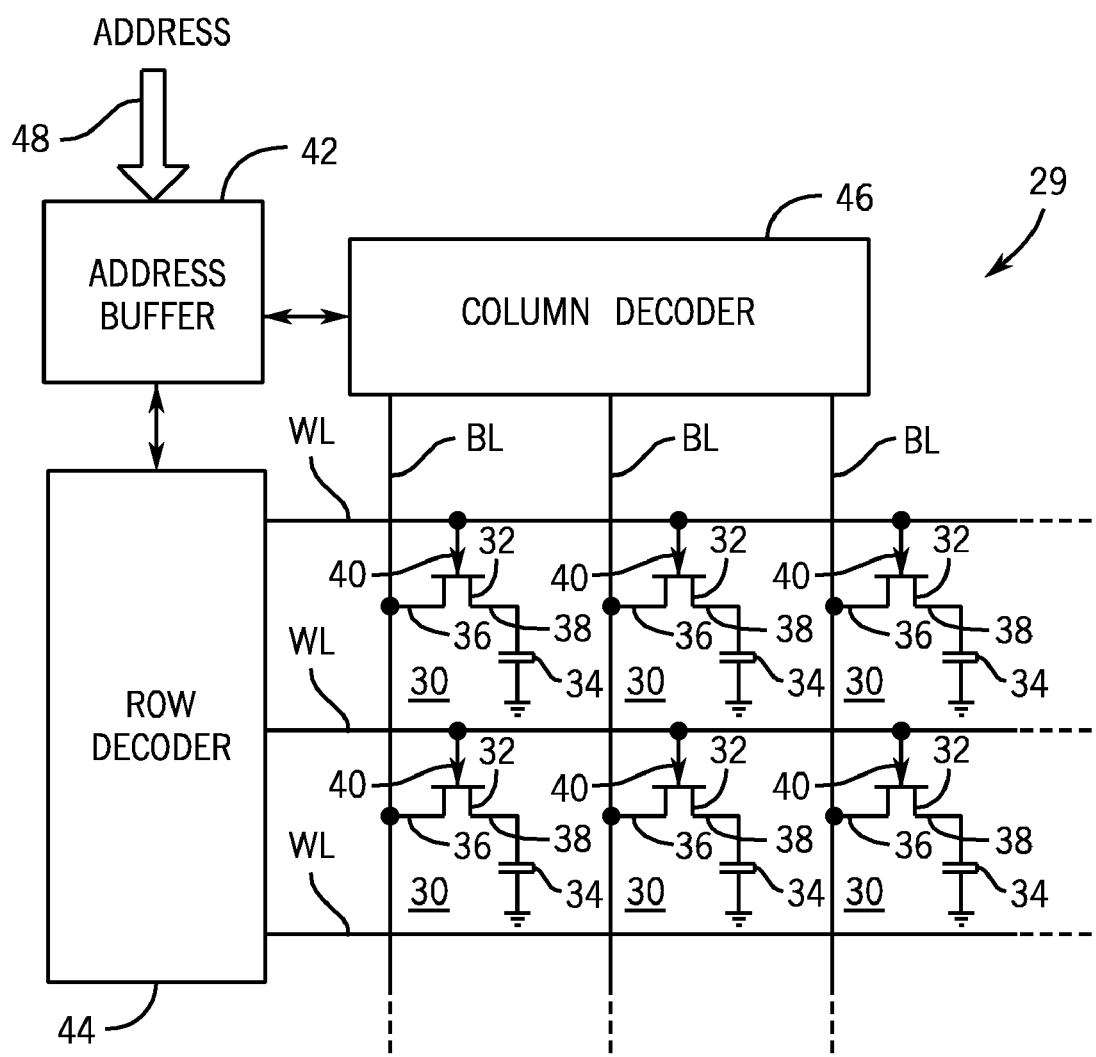
FIG. 2 illustrates a partial schematic illustration of an integrated circuit, incorporating an array of memory cells fabricated in accordance with embodiments of the present invention.

One or more components of the system 10 may include improved JFETs (depicted herein with reference numeral "32" for n-type and "52" for p-type) fabricated in accordance with embodiments described herein. Some examples of devices in which improved JFETs may be beneficial are illustrated in FIGS. 2-5. Specifically, FIG. 2 illustrates a memory device with improved JFETs, and FIGS. 3-5 illustrate integrated circuit logic devices with improved JFETs. FIGS. 6-9 describe the improved JFETs and methods of fabrication.

Referring now to FIG. 2, a partial schematic illustration of an integrated circuit, such as a memory device 29, which may be implemented in the volatile memory 26, is illustrated. The memory device 29 includes an array of memory cells having transistors which may be fabricated in accordance with the techniques described herein. In one or more embodiments, the memory device 29 may comprise a dynamic random access memory (DRAM) device. The memory device 29 includes a number of memory cells 30 arranged in a grid pattern and comprising a number of rows and columns. The number of memory cells 30 (and corresponding rows and columns) may vary depending on system requirements and fabrication technology. Each memory cell 30 includes an access device comprising a JFET 32 and a storage device comprising a capacitor 34. The access device is implemented to provide controlled access to the storage device. The JFET 32 includes a drain terminal 36, a source terminal 38, and a gate 40. The capacitor 34 is coupled to the source terminal 38. The terminal of the capacitor 34 that is not coupled to the JFET 32 may be coupled to a ground plane. As described further below, the drain 36 is coupled to a bit line (BL) and the gate 40 is coupled to a word line (WL).

It should be noted that although the above description depicts the terminal of the access device coupled to the capacitor 34 as the "source" 38 and the other non-gate terminal of the access device as the "drain" 36, during read and write operations, the JFET 32 may be operated such that each of the terminals 36 and 38 operates at one time or another as a source or a drain. Accordingly, for purposes of further discussion it should be recognized that whenever a terminal is identified as a "source" or a "drain," it is only for convenience and that in fact during operation of the JFET 32 either terminal could be a source or a drain depending on the manner in which the JFET 32 is being controlled by the voltages applied to the terminals 36, 38 and 40. In addition, it will be appreciated that embodiments of a memory device 29 may include p-type JFETs, n-type JFETS or a combination of both.

As previously described, the memory array is arranged in a series of rows and columns. To implement the data storage capabilities of a memory cell 30, an electrical charge is placed on the drain 36 of the JFET 32 via a bit line (BL). By controlling the voltage at the gate 40 via the word line (WL), the depletion region between the gate 40 and the channel may be narrowed such that the electrical charge at the drain 36 can flow to the capacitor 34. By storing electrical charge in the capacitor 34, the charge may be interpreted as a binary data value in the memory cell 30. For instance, for a single-bit storage device, a positive charge above a known threshold voltage stored in the capacitor 34 may be interpreted as binary "1." If the charge in the capacitor 34 is below the threshold value, a binary value of "0" is said to be stored in the memory cell 30. For reasons discussed above, it will be appreciated that the voltage at the gate 40 may be limited to a voltage sufficiently below the diode turn-on voltage of the JFET's gate-channel junction.

The bit lines BL are used to read and write data to and from the memory cells 30. The word lines WL are used to activate the JFET 32 to access a particular row of a memory cell 30. Accordingly, the memory device 29 also includes a periphery portion which may include an address buffer 42, row decoder 44 and column decoder 46. The row decoder 44 and column decoder 46 selectively access the memory cells 30 in response to address signals that are provided on the address bus 48 during read, write and refresh operations. The address signals are typically provided by an external controller such as a microprocessor or another type of memory controller. The column decoder 46 may also include sense amplifiers and input/output circuitry to further facilitate the transmission of data to and from the memory cell 30 via the bit lines BL.

In one mode of operation, the memory device 29 receives the address of a particular memory cell 30 at the address buffer 42. The address buffer 42 identifies one of the word lines WL of the particular memory cell 30 corresponding to the requested address and passes the address to the row decoder 44. The row decoder 44 selectively activates the particular word line WL to activate the JFET's 32 of each memory cell 30 that is connected to the selected word line WL. The column decoder 46 selects the bit line (or bit lines) BL of the memory cell 30 corresponding to the requested address. For a write operation, data received by the input/output circuitry is coupled to the selected bit line (or bit lines)

BL and provides for the charge or discharge of the capacitor 34 of the selected memory cell 30 through the JFET 32. The charge corresponds to binary data, as previously described. For a read operation, data stored in the selected memory cell 30, represented by the charge stored in the capacitor 34, is coupled to the select bit line (or bit lines) BL, amplified by the sense amplifier and a corresponding voltage level is provided to the input/output circuitry in the column decoder 46.

As described below, a memory device 29 that uses improved JFETs in accordance with certain disclosed embodiments may exhibit superior performance compared to prior art memory devices. For example, memory device 29 may exhibit increased performance due to the increased switching speed of the improved JFETs 32. Furthermore, because the JFET 32 may be activated by a lower gate voltage compared to typical MOSFET based memory devices, the charge stored on capacitor 34 may also be reduced, which may reduce leakage current of the capacitor 34.

In addition to the memory device 29, improved JFETs may also be used in other parts of the system 10. For example, JFETs fabricated in accordance with the techniques described herein may be used in the processor(s) 12, or any other component of the system 10 that uses integrated circuit logic devices. Referring to FIGS. 3-5, various embodiments of integrated circuit logic devices that include improved JFETs are depicted. Turning first to FIG. 3, an embodiment of a JFET inverter 50 is shown. The JFET inverter 50 includes a p-type JFET 52 and an n-type JFET 32 coupled in series between a high voltage terminal 54 and a low voltage terminal 56. It will be appreciated by a person of ordinary skill in the art that the output terminal 58 will be electrically coupled to the high voltage terminal 54 when the input terminal 60 is low and will be electrically coupled to the low voltage terminal 56 when the input terminal 60 is high.

FIG. 4 depicts an embodiment of a JFET NAND gate 64. The JFET NAND gate 64 includes two p-type JFETs 52 and two n-type JFETs 32 coupled between a high voltage terminal 54 and a low voltage terminal 56 as shown. It will be appreciated by a person of ordinary skill in the art that the output terminal 66 will be electrically coupled to the high voltage terminal 54 when either of input terminal 68 or 70 is low and will be electrically coupled to the low voltage terminal 56 when both input terminals 68 and 70 are high.

FIG. 5 depicts an embodiment of a JFET NOR gate 72. The JFET NOR gate 72 includes two p-type JFETs 52 and two n-type JFETs 32 coupled between a high voltage terminal 54 and a low voltage terminal 56 as shown. It will be appreciated by a person of ordinary skill in the art that the output terminal 74 will be electrically coupled to the high voltage terminal 54 when both input terminals 76 and 78 are low and will be electrically coupled to the low voltage terminal 56 when either of input terminals 76 or 78 is high.

With regard to the logic devices 50, 64, and 72 discussed above, the voltage level applied to the gates 40 and 62 of the JFETs 32 and 52 may be kept below the diode turn-on voltage of the gate-channel junction to avoid excessive gate-to-drain current and the resulting power dissipation. To increase the voltage that may be applied to the JFET gates 40 and 62 without causing gate-to-drain current, the JFETs 32 and 52 may be fabricated in accordance with one or more embodiments that will be discussed below. It will be appreciated that the integrated circuit logic devices depicted in FIGS. 3-5 are examples only and many other JFET logic devices are possible, utilizing improved JFETs in accordance with disclosed embodiments.

Figure 6:
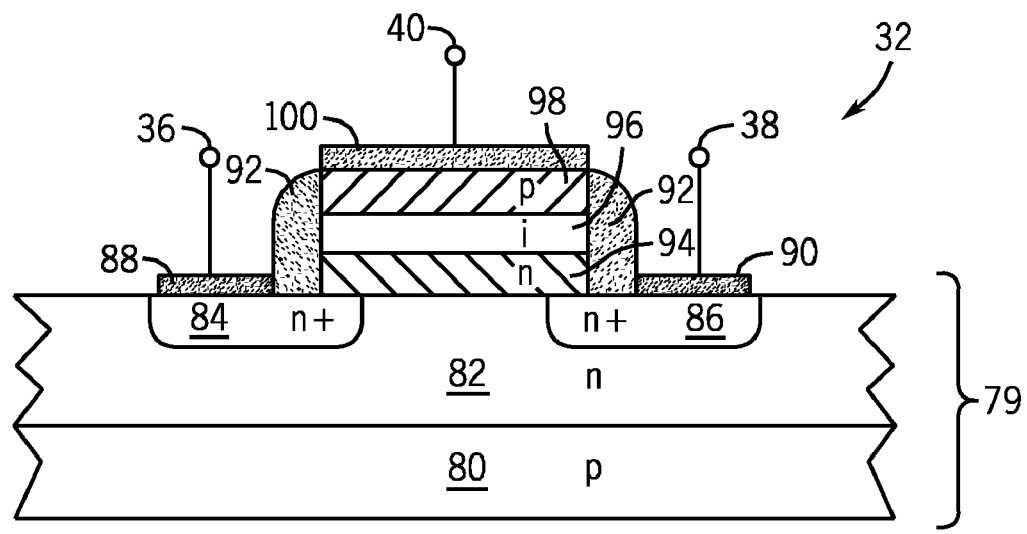
FIGS. 6-8 are cross-sectional views of PIN-gate JFETs in accordance with one or more embodiments of the present invention.
Figure 7:
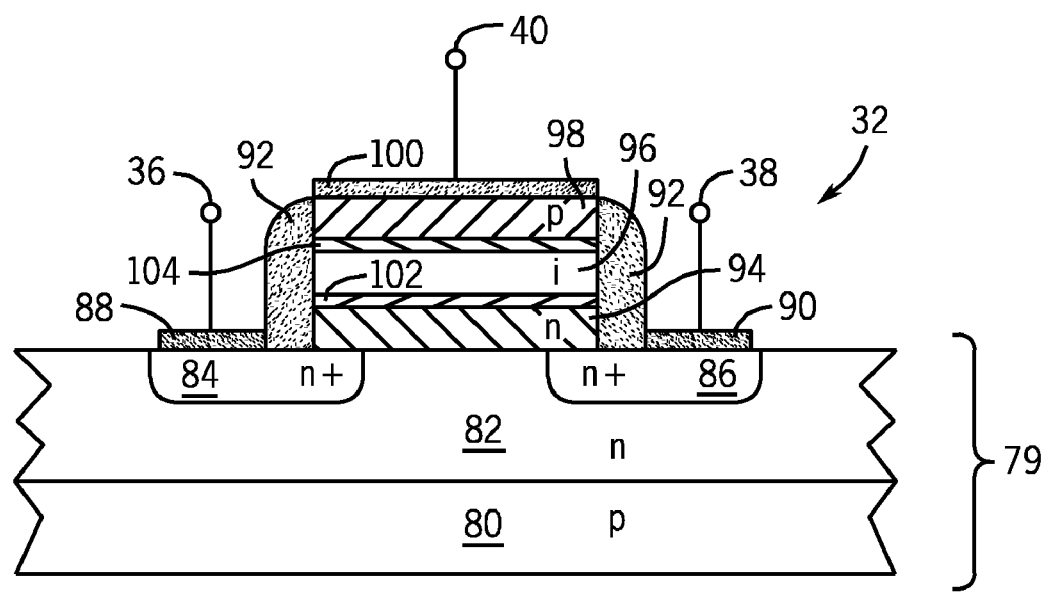
Figure 8:
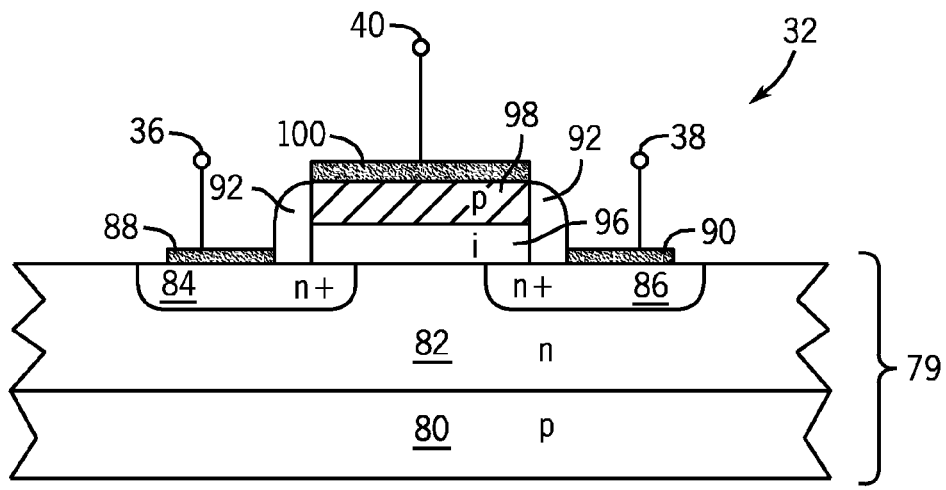

Turning now to FIGS. 6-8, embodiments of improved JFETs are depicted. Generally, FIGS. 6 and 7 depict JFETs with improved gate structures that allow the JFETs to be coupled to a higher gate voltage without exceeding the diode turn-on voltage of the gate-channel junction. In this way, the improved JFET will be less susceptible to the excessive power loss associated with exceeding the diode turn-on voltage of the gate-channel junction. By improving the performance of the JFET in this way, the improved JFETs may be used in a greater variety of semiconductor devices, as discussed above.

Accordingly, FIGS. 6-8 depict an n-type, i.e. n-channel, JFET 32 with a gate structure having doped and undoped portions in accordance with one or more embodiments of the present invention. For example, as described further below, the gate structure may include an intrinsic material sandwiched between a p-type and an n-type material to provide a p-i-n (PIN) gate. It will be appreciated that an n-type JFET 32 is described for convenience only, and that embodiments of the present invention also include p-type, i.e. p-channel, JFETs. Therefore, it will be understood that the term "PIN" is not intended to refer to a particular ordering of the p-type and n-type materials. Furthermore, the JFET 32 depicted in FIGS. 6-8 may be fabricated in any semiconductor material, such as the silicon substrate 79, or, alternatively, a silicon-on-insulator (SOI) substrate (not shown).

As shown in FIGS. 6-8, the JFET 32 may be fabricated on top of a p-type material 80. Accordingly, the silicon substrate 79 may be a p-type substrate, or, alternatively, a p-type material 80 may be formed by creating a p-type well in the substrate 79. The p-type material 80 may also be electrically coupled to the gate terminal 40 via a terminal (not shown) that is directly coupled to the p-type material 80. In alternative embodiments, the JFET 32 may not include the underlying p-type material 80.

Above the p-type material 80, the n-type JFET 32 depicted in FIGS. 6-8 may also include a semiconductor material 82, which is n-doped and forms a channel region between the source terminal 36 and the drain terminal 38. In addition, the JFET 32 may include an n-type source region 84 and an n-type drain region 86, which may optionally be heavily doped in order to provide a low resistance between the source and drain electrodes 88 and 90 and the channel region. In some embodiments, the JFET 32 may also include lightly doped drain (LDD) regions. Spacer oxides 92 may also be included to separate the source and drain electrodes 88 and 90 from the gate structure. Also included in the JFET 32 is a gate contact 100, which may be formed of any suitable metal or polysilicon conductor and facilitates the electrical connection between the top material 98 of the gate and the gate terminal 40.

Turning specifically to FIG. 6, a JFET 32 with a three-layer PIN gate in accordance with embodiments of the present invention is depicted. As shown in FIG. 6, the PIN gate may be a stack of three semiconductor materials, which may include any semiconductor material, such as silicon, silicon carbide, germanium, carbon-implanted silicon, silicon-germanium heterostructures or a combination thereof. The bottom material 94 of the PIN gate is n-doped and located directly on the semiconductor substrate 79 over the channel region formed in the semiconductor material 82. Above the bottom material 94 is an intrinsic material 96. Above the intrinsic material 96 is a p-doped top material 98. Thus, the gate structure essentially forms a PIN diode disposed directly on the channel region.

In certain embodiments, both the bottom material 94 and the top material 98 may be approximately 500 to 700 angstroms thick and doped at a level of approximately 1e17 to 1e20 atoms per cubic centimeter. In the embodiment shown in FIG. 6, the bottom material 94 is n-doped and the top material 98 is p-doped, however, in embodiments in which the channel is p-doped, the bottom material 94 is also p-doped and the top material 98 is n-doped. The intrinsic material 96 may be approximately 50 to 200 angstroms thick and may be undoped or lightly doped. It will be understood by a person of ordinary skill in the art that the term "intrinsic" may be used to describe a semiconductor that is undoped or lightly doped. Furthermore, in some embodiments, the intrinsic material 96 may be silicon implanted with carbon. Implanting the silicon with carbon increases the bandgap of the intrinsic material 96, and may therefore increase the diode turn-on voltage of the JFET 32.

The advantage of forming a PIN gate as described above is that the diode turn-on voltage of the JFET 32 may be increased. In some embodiments, the diode turn-on voltage may be increased up to approximately 0.5 to 2.0 volts higher than JFETs that use conventional gate structures. This may allow for the use of n-JFETs and p-JFETs in logic devices and/or memory devices, such as those described in relation to FIGS. 1-5, with the advantage of significantly reduced gate capacitance.

Furthermore, the diode turn-on voltage of the JFET 32 may be manipulated by controlling the thicknesses and doping levels of the three PIN gate materials 94, 96 and 98. For example, the diode turn-on voltage may be increased by increasing the thickness of the intrinsic material 96. Other characteristics of the JFET may also be manipulated. For example, the doping level of the bottom material 94 may be controlled so that the depletion layer may extend completely through the conductive channel in the semiconductor material 82 when the JFET 32 is switched off. For another example, the top material 98 may be heavily doped to provide good contact characteristics with the gate contact 100 and to increase the depth of penetration of the depletion region into the channel.

In some embodiments, the doping levels of the bottom material 94 and top material 98 may be kept low to avoid excessive diffusion of the dopants into the intrinsic material 96. In addition to keeping the dopant levels low, diffusion of dopants into the intrinsic material 96 may also be avoided by including thin insulators between the materials, as shown in FIG. 7.

Turning to FIG. 7, a JFET 32 with a three-layer PIN gate in accordance with another embodiment of the present invention is depicted. As shown in FIG. 7, one or more embodiments may also include a first protective material 102, located between the bottom material 94 and the intrinsic material 96, and a second protective material 104, located between the intrinsic material 96 and the top material 98. The protective materials 102 and 104 may include a native oxide or may include other dielectric materials such as hafnium oxide, aluminum oxide, zirconium oxide and titanium dioxide. The thickness of the protective materials 102 and 104 may be in the range of approximately five to twenty angstroms. Although the protective materials 102 and 104 are made of electrically insulative material, the protective materials 102 and 104 are thin enough that the PIN gate materials 94, 96, and 98 are strongly coupled electrostatically. Therefore, the protective materials 102 and 104 may not significantly decrease the conductivity of the PIN gate structure. However, the protective materials 102 and 104 may prevent the passage of n-type and p-type dopants present in the bottom material 94 and the top material 98. In this way, the dopants may be prevented from diffusing into the intrinsic material 96 during certain high-temperature processes typically used in semiconductor device fabrication. In alternative embodiments, the gate structure of the JFET 32 may include either the first protective material 102 or the second protective material 104, but not both.

Figure 7A:
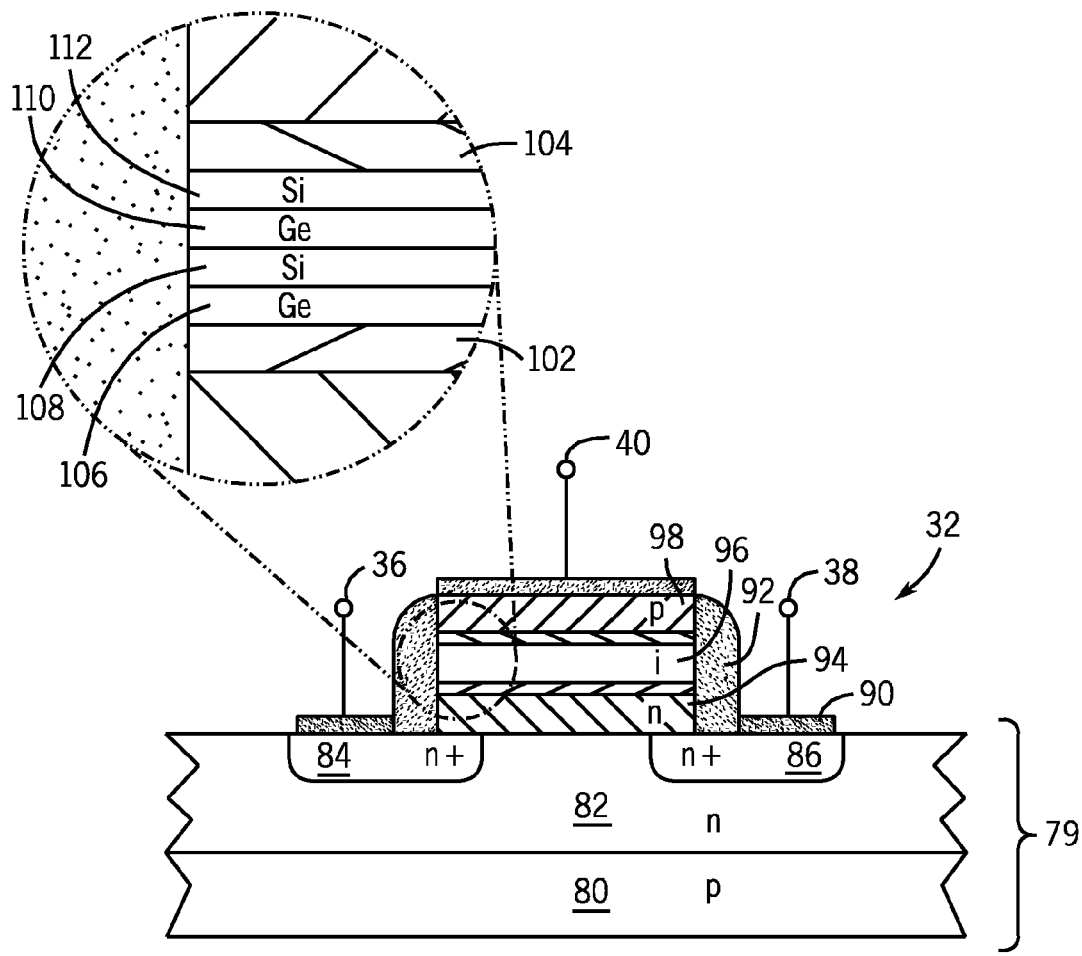

Turning to FIG. 7A, another embodiment of a PIN gate in accordance with embodiments of the present invention is depicted. As shown in FIG. 7A, the diode turn-on voltage of the JFET 32 may be further increased by forming the intrinsic material 96 with a silicon-germanium heterostructure. The silicon-germanium heterostructure may be formed from alternating formations of intrinsic germanium 106, 110 and intrinsic silicon 108, 112. Although four formations are depicted, embodiments may include any number of formations and may include a number of silicon formations unequal to the number of germanium formations. Each formation 106, 108, 110, 112 may be a monolayer approximately 10 angstroms thick.

Because the germanium and silicon exhibit different bandgaps, a barrier height will exist at the boundary between the silicon formations 108, 112 and the germanium formations 106, 110. One of ordinary skill in the art will appreciate that the "barrier height" represents an amount of energy that a charge carrier must obtain to move from one material to another. The increased barrier height may, therefore, increase the diode turn-on voltage of the gate-channel junction.

Turning to FIG. 8, a JFET 32 with a two-layer PIN gate in accordance with another embodiment of the present invention is depicted. As shown in FIG. 8, the intrinsic material 96 may be located directly on the channel region and may be approximately 50 to 200 angstroms thick. As before, the top material 98 is p-doped and located over the intrinsic material 96, however, unlike the previously described embodiments the bottom material 94 is eliminated. Nevertheless, the gate structure still resembles a PIN diode, with the n-type channel essentially taking the place of the n-type bottom material 94. In some embodiments, a protective material may also be included between the top material 98 and the intrinsic material 96, as described above in relation to FIG. 7.

Figure 9:
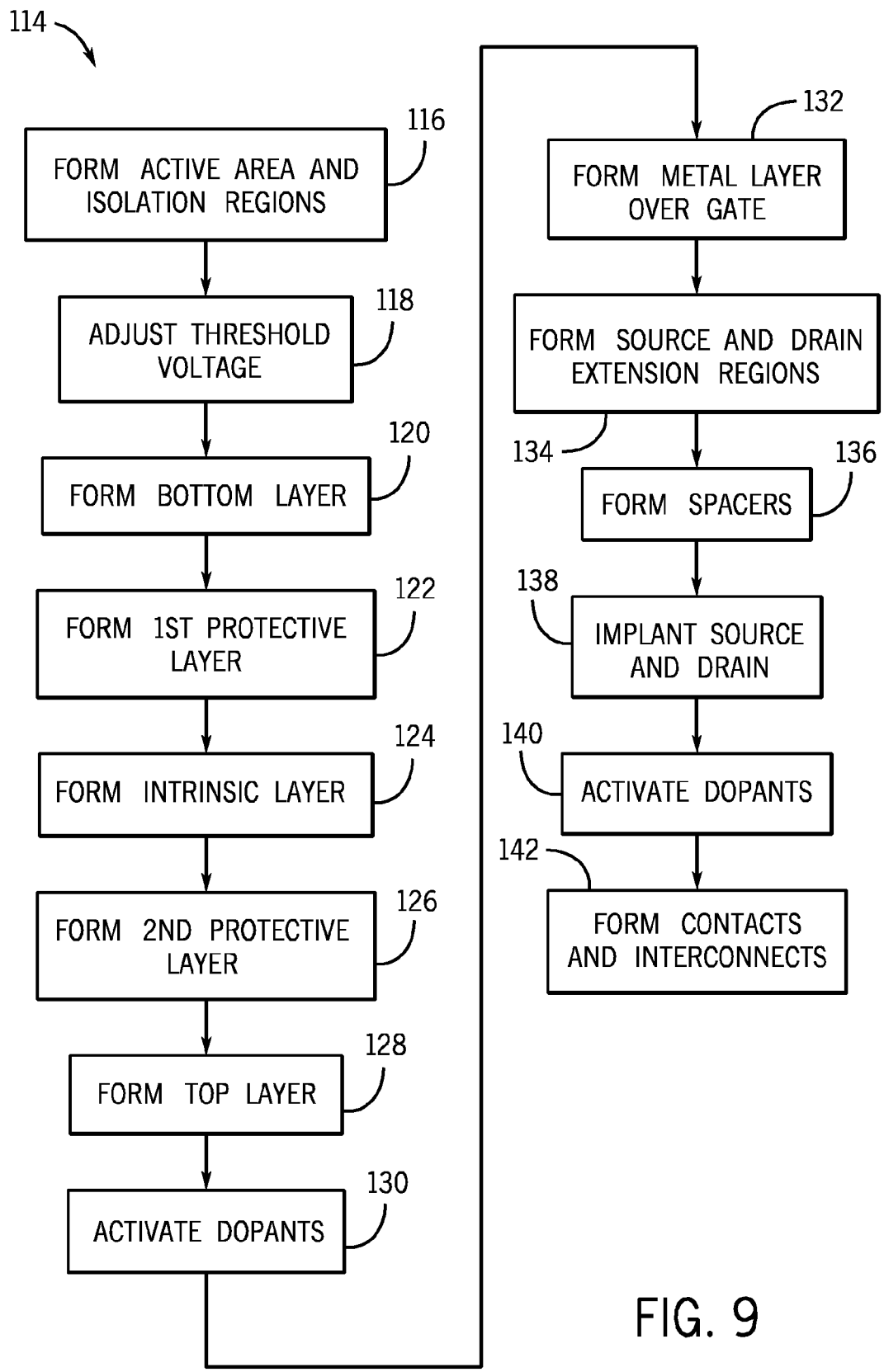
FIGS. 9 is a flow chart depicting processes for fabricating PIN-gate JFETs in accordance with one or more embodiments of the present invention.

Turning now to FIG. 9, a process for fabricating an improved JFET 32 in accordance with embodiments of the present invention is shown. The process 114 may be used to fabricate individual JFETs, JFET arrays, or complementary JFET devices such as those described in relation to FIGS. 2-5.

The process 114 starts with bulk semiconductor substrate 79 or silicon-on-insulator (SOI) substrate, which is processed at step 116 to form an active area and isolation regions using conventional lithography, oxidation and dopant implantation processes. At step 116, p-doped and/or n-doped wells may be formed for the creation of n-type and/or p-type JFETs, respectively. In addition, a triple well may optionally be formed to provide increased isolation for the JFET device.

Next at step 118, the threshold voltage of the device is adjusted by doping the active region of the JFET in accordance with techniques known to those of ordinary skill in the art. After adjusting the threshold voltage at step 118, the process 114 may advance to step 120.

At step 120, the bottom material 94 of the PIN gate stack is formed directly on the substrate 79 over the channel region. The bottom material 94 may be formed of any suitable semiconductor material, such as silicon. The bottom material 94 may be deposited by chemical vapor deposition (CVD) or grown epitaxially via atomic layer deposition (ALD) to a thickness of approximately 500 to 700 angstroms. After depositing the bottom material 94, the bottom material 94 is doped to a level of approximately 1e17 to 1e20 atoms per cubic centimeter. For an n-type JFET, the bottom material 94 is doped n-type, and for a p-type JFET, the bottom material 94 is doped p-type. Alternatively, the bottom material may be omitted or may be a part of the substrate 79, as described and illustrated with reference to FIG. 8.

At step 122, the first protective material 102 may be formed over the bottom material 94. The first protective material 102 may be formed by growing a native oxide, or depositing a high dielectric constant dielectric material such as hafnium oxide, aluminum oxide, zirconium oxide and titanium dioxide through one or more ALD cycles. The first protective material 102 may be formed to a thickness in the range of approximately five to twenty angstroms. As described above, the formation of the first protective material 102 may be omitted in certain embodiments.

Next, at step 124, the intrinsic material 96 may be formed over the first protective material 102 or the underlying bottom material 94 to a thickness of approximately 50 to 200 angstroms. The instrinsic material 96 may be deposited by chemical vapor deposition (CVD) or grown epitaxially. As described above in relation to FIG. 6, the intrinsic material 96 may be formed of silicon and may also be implanted with carbon. Therefore, after depositing the intrinsic material 96, carbon may be implanted at a dose of $1.0e16$ atoms per cubic centimeter with an implant energy of approximately 1 to 5 keV.

Furthermore, as described above in relation to FIG. 7A, the intrinsic material 96 may also be a heterostructure. Therefore, the intrinsic material 96 may be formed by depositing alternating monolayers of germanium and silicon. The process may begin by depositing either germanium or silicon over the first protective material 102 or, if the first protective material 102 is omitted, the underlying bottom material 94. Each material may be formed to a thickness of approximately ten angstroms and may be formed by chemical vapor deposition (CVD) or grown epitaxially.

Next, at step 126, the second protective material 104 may be formed over the intrinsic material 96. As with the first protective material 102, the second protective material 104 may be formed to a thickness of approximately ten angstroms by growing a native oxide, or depositing a high dielectric constant dielectric material via ALD or may be omitted.

Next, at step 128, the top material 98 of the PIN gate stack may be formed over the second protective material 104 or the underlying intrinsic material 96. As with the bottom material 94, the top material 98 may be formed of any suitable semiconductor material, such as silicon and deposited by chemical vapor deposition (CVD) or grown epitaxially via atomic layer deposition (ALD) to a thickness of approximately 500 to 700 angstroms. After depositing the top material 98, the top material 98 may be doped to a level of approximately $1e17$ to $1e20$ atoms per cubic centimeter. For an n-type JFET, the top material 98 will be doped p-type, and for a p-type JFET, the top material 98 will be doped n-type.

Next, at step 130 the PIN gate dopants are activated by annealing at a temperature in the range of 1000 degrees Celsius for a time period of approximately 5 seconds.

After finishing the steps described above, the gate structure will be substantially complete. The process 114 will then advance to step 132, in which a gate contact material is formed over the top material 98 of the PIN gate stack with a thickness of approximately 200 to 1000 angstroms to form the gate contact 100. The gate contact material may include any suitable metal, such as tungsten, nickel, titanium, tantalum, or cobalt, and may be formed by any method known in the art for depositing metal on semiconductor, such as CVD, physical vapor deposition (PVD), or sputtering for example. In one or more embodiments, the gate contact material may include a metal silicide, such as tungsten silicide, nickel silicide, titanium silicide, tantalum silicide, or cobalt silicide, and may be formed by growing or depositing polysilicon by CVD or low pressure CVD and doping the polysilicon through a process such as diffusion doping or ion implantation. After depositing the gate contact material, the gate contact 100 may be patterned using known photolithography techniques and formed using known etching techniques. In some embodiments, such as when the gate itself is metal, the step of forming a gate contact 100 over the gate may be eliminated.

Next, at step 134, the source and drain regions are formed using a technique such as gate-self-aligned implantation to create source and drain extension regions known as lightly-doped-drain (LDD) regions. The source and drain regions may be doped with any suitable dopants, such as boron, $BF_2$, or indium for p-type doping, or arsenic, phosphorous, or antimony for n-type doping. Dopants may be implanted with a dose in the range of $1e13$ to $1e15$ atoms per cubic centimeter and an implant energy in the range of 5 to 30 keV. In some embodiments, the implantation may optionally be accomplished through plasma assisted doping (PLAD).

Next, at step 136, the spacers 92 may be formed. To form the spacers 92 an oxide, nitride or other dielectric material or combination of materials may be formed over the top and sides of the gate stack. After depositing the spacer material, the spacers 92 are formed on the sides of the gate to a thickness of approximately 100 to 500 angstroms using photolithography and etching techniques known in the art.

Next, at step 138 the source and drain regions 84 and 86 may be implanted to form heavily doped n+ or p+ source and drain regions. The source and drain regions may be doped with any suitable dopants, such as boron, $BF_2$, or decaborane for p-type doping, or arsenic or phosphorous for n-type doping. Dopants may be implanted with a dose in the range of $1e15$ to $1e16$ atoms per cubic centimeter and an implant energy in the range of 0.5 to 10 keV.

Next, at step 140 the dopants implanted in previous steps are activated. First, a dielectric material, such as an oxide, nitride or combination is deposited to cap the active area. Then, the dopants are activated by an rapid thermal anneal or laser anneal. For example, the anneal may occur at 1000 to 1100 degrees Celsius and last for 2 to 10 seconds.

Finally, at step 142, all of the remaining contacts and interconnects may be formed in accordance with processes that are well known in the art. Those of ordinary skill in the art will recognize process variations that may be implemented while still remaining within the scope of the present invention.

Those of ordinary skill in the art will recognize the advantages of forming a JFET in accordance with the process described above. Specifically, by forming a gate that includes a PIN gate stack, the diode turn-on voltage of the JFET may be increased. Therefore, unlike prior art, the presently described embodiments may operate under a larger operating voltage compared to conventional JFETs while still maintaining a low gate current. Consequently, this may allow the use of JFETs in a wider range of electronic devices, such as the logic devices and memory storage devices described above.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A transistor, comprising:
 a semiconductor substrate comprising a source region and a drain region;
 a doped channel region formed in the semiconductor substrate between the source region and the drain region, the channel region configured to pass current between the source region and the drain region; and
 a gate comprising a first semiconductor material formed over the channel region, a second semiconductor material formed over the first semiconductor material, a third semiconductor material formed over the second semiconductor material, and at least one protective material formed on a surface of the second semiconductor material and configured to inhibit the migration of a dopant into the second semiconductor material, wherein the at least one protective material comprises a first protective material located between the first semiconductor material and the second semiconductor material, and a second protective material located between the second semiconductor material and the third semiconductor material;
 wherein the first semiconductor material is the same dopant type as the channel region, the second semiconductor material is intrinsic, and the third semiconductor material is the opposite dopant type as the channel region.

2. The transistor of claim 1, wherein the at least one protective material comprises hafnium oxide, aluminum oxide, zirconium oxide, or titanium dioxide.

3. The transistor of claim 1, wherein a diode turn-on voltage of the transistor is approximately 1 to 2.5 volts.

4. The transistor of claim 1, wherein the at least one protective material is approximately 10 angstroms thick.

5. A system comprising:
 a processor; and
 a memory device;
 wherein the system includes at least one junction field effect transistor, comprising:
  a semiconductor substrate comprising a source region and a drain region; and
  a gate formed directly on a top surface of the semiconductor substrate, the gate configured to form a PIN diode.

6. The system of claim 5, wherein the gate comprises an intrinsic material formed directly on the semiconductor substrate and a doped semiconductor formed directly on the intrinsic material.

7. The system of claim 5, wherein the gate comprises a first semiconductor material with a first dopant type formed directly on the semiconductor substrate, an intrinsic semiconductor material formed directly on the first semiconductor material, and a second semiconductor material with a second doping type formed directly on the intrinsic semiconductor material.

8. The system of claim 5, wherein the at least one junction field effect transistor is configured to create a complimentary logic device.

9. The system of claim 5, wherein the at least one junction field effect transistor is configured to create an access device in the memory device.

10. The system of claim 5, wherein the gate comprises a heterostructure.

11. A memory device, comprising:
 a JFET transistor comprising a channel region with a source region and a drain region;
 a charge storage device electrically coupled to either the source region or the drain region; and
 a gate stack formed over the channel region between the source region and the drain region and configured to control the charging and discharging of the charge storage device, the gate stack comprising an intrinsic semiconductor material and at least one doped semiconductor material.

12. The memory device of claim 11, wherein the gate stack comprises a protective material arranged between the intrinsic semiconductor material and the at least one doped semiconductor material, the protective material configured to inhibit the diffusion of dopants into the intrinsic semiconductor material.

13. The memory device of claim 11, wherein the at least one doped semiconductor material comprises a p-type semiconductor material and an n-type semiconductor material, and wherein the p-type semiconductor material and the n-type semiconductor material are separated by the intrinsic semiconductor material.

14. The memory device of claim 13, wherein the p-type semiconductor material and the n-type semiconductor material are separated from the intrinsic semiconductor material by a protective material configured to inhibit the migration of dopants into the intrinsic semiconductor material.

15. The memory device of claim 13, wherein the diode turn-on voltage of the JFET transistor is greater than approximately one volt.

16. The memory device of claim 13, wherein the intrinsic semiconductor material comprises alternating formations of silicon and germanium.

* * * * *